(12) United States Patent
Fiedler

(10) Patent No.: US 9,543,937 B2
(45) Date of Patent: Jan. 10, 2017

(54) MULTI-PHASE CLOCK GENERATION

(71) Applicant: MICROSOFT TECHNOLOGY LICENSING, LLC, Redmond, WA (US)

(72) Inventor: Alan S. Fiedler, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 164 days.

(21) Appl. No.: 14/476,627

(22) Filed: Sep. 3, 2014

(65) Prior Publication Data

US 2016/0065196 A1    Mar. 3, 2016

(51) Int. Cl.
| | |
|---|---|
| H03L 7/081 | (2006.01) |
| H03K 5/159 | (2006.01) |
| G06F 1/04 | (2006.01) |
| H03K 5/135 | (2006.01) |
| H03K 5/13 | (2014.01) |
| H03K 5/00 | (2006.01) |

(52) U.S. Cl.
CPC .............. *H03K 5/159* (2013.01); *G06F 1/04* (2013.01); *H03K 5/133* (2013.01); *H03K 5/135* (2013.01); *H03L 7/0812* (2013.01); *H03K 2005/00019* (2013.01)

(58) Field of Classification Search
CPC ........................................................ H03L 7/08
See application file for complete search history.

(56) References Cited

U.S. PATENT DOCUMENTS

| | | | |
|---|---|---|---|
| 4,742,532 A | 5/1988 | Walker | |
| 5,572,721 A | 11/1996 | Rostamian | |
| 5,805,089 A | 9/1998 | Fiedler et al. | |
| 5,939,929 A | 8/1999 | Tsinker | |
| 5,945,862 A * | 8/1999 | Donnelly | H03K 5/13 327/241 |
| 6,078,514 A | 6/2000 | Takemae et al. | |
| 6,085,257 A | 7/2000 | Ducaroir et al. | |
| 6,104,228 A * | 8/2000 | Lakshmikumar | H03K 5/135 327/284 |
| 6,400,616 B1 | 6/2002 | Tamura et al. | |

(Continued)

OTHER PUBLICATIONS

Kolodziejski, et al., "Current Controlled Delay Line Elements Improvement Study", In Proceedings of International Conference on Signals and Electronic Systems, Sep. 18, 2012, 4 pages.

(Continued)

*Primary Examiner* — Ryan Jager
(74) *Attorney, Agent, or Firm* — Gregg Wisdom; Judy Yee; Micky Minhas

(57) ABSTRACT

Embodiments are disclosed that relate to multi-phase clock generators and data samplers for use in high speed I/O circuitry. One disclosed example provides a multi-phase clock generator including a delay line having a plurality of delay elements, the delay line being configured to receive an input clock signal and output a plurality of output clock signals having different phases compared to a phase of the input clock signal. The multi-phase clock generator further includes a control circuit configured to control the delay line based at least in part upon rising edges and falling edges of one or more output clock signals output at one or more locations along the delay line.

20 Claims, 11 Drawing Sheets

(56) References Cited

U.S. PATENT DOCUMENTS

| | | | |
|---|---|---|---|
| 6,490,628 B2 | 12/2002 | Hindie et al. | |
| 6,677,793 B1 | 1/2004 | Chan et al. | |
| 6,759,881 B2* | 7/2004 | Kizer | G06F 1/10 |
| | | | 327/147 |
| 6,794,918 B1 | 9/2004 | Lu et al. | |
| 6,910,092 B2 | 6/2005 | Calvignac et al. | |
| 6,911,853 B2* | 6/2005 | Kizer | G06F 1/10 |
| | | | 327/158 |
| 6,952,123 B2* | 10/2005 | Kizer | G06F 1/10 |
| | | | 327/147 |
| 7,009,434 B2* | 3/2006 | Lee | G11C 7/22 |
| | | | 327/158 |
| 7,020,729 B2 | 3/2006 | Taborek, Sr. et al. | |
| 7,135,903 B2* | 11/2006 | Kizer | G06F 1/10 |
| | | | 327/159 |
| 7,187,721 B1 | 3/2007 | Dally et al. | |
| 7,443,913 B2 | 10/2008 | Bhakta et al. | |
| 7,474,136 B2 | 1/2009 | Heightley | |
| 7,539,243 B1 | 5/2009 | Toifl et al. | |
| 7,571,340 B2 | 8/2009 | Jiang | |
| 7,577,861 B2 | 8/2009 | Levin et al. | |
| 7,587,537 B1 | 9/2009 | Burney | |
| 7,675,333 B2 | 3/2010 | Bhowmik et al. | |
| 7,759,997 B2 | 7/2010 | Fiedler | |
| 7,809,054 B2 | 10/2010 | Carballo et al. | |
| 7,814,250 B2 | 10/2010 | Bracamontes Del Toro | |
| 7,821,316 B2 | 10/2010 | Fiedler | |
| 7,844,023 B2 | 11/2010 | Farjad-Rad | |
| 7,848,367 B2 | 12/2010 | Hornbuckle et al. | |
| 8,294,501 B1 | 10/2012 | Thomas et al. | |
| 8,415,980 B2 | 4/2013 | Fiedler | |
| 8,493,107 B2* | 7/2013 | Staszewski | H03L 7/0996 |
| | | | 327/141 |
| 8,527,676 B2 | 9/2013 | Morrison et al. | |
| 2002/0000853 A1 | 1/2002 | Chen et al. | |
| 2007/0085580 A1 | 4/2007 | Singh et al. | |
| 2007/0156932 A1 | 7/2007 | Kasahara et al. | |
| 2008/0169853 A1 | 7/2008 | Park et al. | |
| 2009/0066546 A1* | 3/2009 | Yonezawa | H04L 7/0337 |
| | | | 341/100 |
| 2009/0116839 A1 | 5/2009 | Kikuchi et al. | |
| 2009/0252215 A1 | 10/2009 | Bulzacchelli et al. | |
| 2010/0076385 A1 | 3/2010 | Huang et al. | |
| 2010/0085099 A1* | 4/2010 | Ma | G06F 1/06 |
| | | | 327/295 |
| 2010/0103746 A1 | 4/2010 | Ma | |
| 2010/0253405 A1 | 10/2010 | Quan et al. | |
| 2011/0026355 A1* | 2/2011 | Irisawa | G06F 13/4291 |
| | | | 365/233.1 |
| 2011/0090947 A1 | 4/2011 | Peng et al. | |
| 2012/0128055 A1 | 5/2012 | Jiang | |
| 2012/0224613 A1 | 9/2012 | Loh | |
| 2013/0002300 A1 | 1/2013 | Fiedler | |
| 2013/0007500 A1 | 1/2013 | Fiedler | |
| 2013/0107935 A1 | 5/2013 | Zhou et al. | |
| 2013/0111307 A1 | 5/2013 | Zhou et al. | |
| 2015/0130520 A1* | 5/2015 | Matsuda | H03L 7/085 |
| | | | 327/156 |
| 2015/0160012 A1* | 6/2015 | Ii | G01C 19/5776 |
| | | | 73/504.12 |

OTHER PUBLICATIONS

Sidiropoulos, et al., "A Semidigital Dual Delay-Locked Loop", In IEEE Journal of Solid-State Circuits, vol. 32, No. 11, Nov. 1997, pp. 1683-1692.

Agrawal, et al., "A 8×5 Gb/s Source-Synchronous Receiver with Clock Generator Phase Error Correction", In IEEE Custom Integrated Circuits Conference, Sep. 21, 2008, 4 pages.

Ghanbari, et al., "High Speed Delay-Locked Loop for Multiple Clock Phase Generation", In Journal of Electrical and Computer Engineering Innovations, vol. 1, No. 1, Mar. 24, 2014, pp. 19-27.

Chung, et al., "A 1.22mW/Gb/s 9.6Gb/s Data Jitter Mixing Forwarded-Clock Receiver Robust against Power Noise with 1.92ns Latency Mismatch between Data and Clock in 65nm CMOS", In Proceedings of Symposium on VLSI Circuits, Jun. 13, 2012, 2 pages.

Rao, et al., "A 4-6.4 GHz LC PLL With Adaptive Bandwidth Control for a Forwarded Clock Link", In IEEE Journal of Solid-State Circuits, vol. 43, No. 9, Sep. 2008, pp. 2099-2108.

Kim, et al., "A 7.4 Gb/s Forwarded Clock Receiver Based on First-Harmonic Injection-Locked Oscillator Using AC Coupled Clock Multiplication Unit in 0.13µm CMOS", In IEEE Custom Integrated Circuits Conference, Sep. 19, 2011, 4 pages.

Huang, et al., "A 9.6Gb/s 5+1-Lane Source Synchronous Transmitter in 65nm CMOS Technology", In IEEE International Symposium on Circuits and Systems, May 20, 2012, pp. 313-316.

Loke, et al., "An 8.0-Gb/s HyperTransport Transceiver for 32-nm SOI-CMOS Server Processors", In IEEE Journal of Solid-State Circuits, vol. 47, No. 11, Nov. 2012, pp. 2627-2642.

Chung, et al., "An 8Gb/s Forwarded-Clock I/O Receiver with up to 1GHz Constant Jitter Tracking Bandwidth Using a Weak Injection-Locked Oscillator in 0.13um CMOS", In Proceedings of Symposium on VLSI Circuits, Jun. 15, 2011, pp. 84-85.

Doyle, et al., "Extending HyperTransport™ Technology to 8.0 Gb/s in 32-nm SOI-CMOS Processors", In IEEE Asian Solid-State Circuits Conference, Nov. 14, 2011, pp. 133-136.

Shekhar, et al., "Strong Injection Locking in Low-Q LC Oscillators: Modeling and Application in a Forwarded-Clock I/O Receiver", In IEEE Transactions on Circuits and Systems—I: Regular Papers, vol. 56, No. 8, Aug. 2009, pp. 1818-1829.

Pozzoni, et al., "A Multi-Standard 1.5 to 10 Gb/s Latch-Based 3-Tap DFE Receiver With a SSC Tolerant CDR for Serial Backplane Communication", In IEEE Journal of Solid-State Circuits, vol. 44, Issue 4, Apr. 2009, 10 pages.

Seong, et al., "A 10-Gb/s Adaptive Look-Ahead Decision Feedback Equalizer with an Eye-Opening Monitor", In IEEE Transactions on Circuits and Systems II: Express Briefs, vol. 59, Issue 4, Apr. 2012, 5 pages.

Dickson, et al., "An 8 10-Gb/s Source-Synchronous I/O System Based on High-Density Silicon Carrier Interconnects", In Proceedings of Symposium on VLSI Circuits Jun. 15, 2011, pp. 80-81.

Gangasani, et al., "A 16-Gb/s Backplane Transceiver with 12-Tap Current Integrating DFE and Dynamic Adaptation of Voltage Offset and Timing Drifts in 45-nm SOI CMOS Technology", In IEEE Journal of Solid-State Circuits, vol. 47, Issue 8, Aug. 2012, pp. 1828-1841.

Spagna, et al., "A 78mW 11.8Gb/s serial link transceiver with adaptive RX equalization and baud-rate CDR in 32nm CMOS", In IEEE International Solid-State Circuits Conference Digest of Technical Papers, Feb. 7, 2010, 3 pages.

Thakkar, et al., "A 10Gb/s 45mW Adaptive 60GHz Baseband in 65nm CMOS", In Proceedings of Symposium on VLSI Circuits, Jun. 15, 2011, pp. 24-25.

Stojanovic, et al., "Optimal Linear Precoding with Theoretical and Practical Data Rates in High-Speed Serial-Link Backplane Communication", In IEEE International Conference on Communications, vol. 5, Jun. 20, 2004, pp. 2799-2806.

Madden, et al., "Jitter Amplification Considerations for PCB Clock Channel Design", In IEEE 16th Topical Meeting Electrical Performance of Electrnoic Packaging, Oct. 29, 2007, pp. 135-138.

Reutemann, et al., "A 4.5 mW/Gb/s 6.4 Gb/s 22+1-Lane Source Synchronous Receiver Core with Optional Cleanup PLL in 65 nm CMOS", In IEEE Journal of Solid-State Circuits, vol. 45, Issue 12, Dec. 2010, pp. 2850-2860.

Galal, et al., "Broadband ESD Protection Circuits in CMOS Technology", In IEEE International Solid-State Circuits Conference Digest of Technical Papers, Feb. 13, 2003, 10 pages.

McCreary, et al., "All-MOS Charge Redistribution Analog-to-Digital Conversion Techniques—Part I", In IEEE Journal of Solid-State Circuits, vol. SC 10, No. 6, Dec. 1975, pp. 371-379.

Neyestanak, et al., "A 6.0-mW 10.0-Gb/s Receiver with Switched-Capacitor Summation DFE", In IEEE Journal of Solid-State Circuits, vol. 42, Issue 4, Apr. 2007, pp. 889-896.

(56) References Cited

OTHER PUBLICATIONS

Honarvar, et al., "A 15Gb/s 0.5mW/Gb/s 2-tap DFE Receiver with Far-End Crosstalk Cancellation", In IEEE International Solid-State Circuits Conference Digest of Technical Papers, Feb. 20, 2011, pp. 3 pages.
Park, et al., "A 7Gb/s 9.3mW 2-Tap Current-Integrating DFE Receiver", In IEEE International Solid-State Circuits Conference Digest of Technical Papers, Feb. 11, 2007, 3 pages.
Dickson, et al., "A 12-Gb/s 11-mW Half-Rate Sampled 5-Tap Decision Feedback Equalizer with Current-Integrating Summers in 45-nm SOI CMOS Technology", In IEEE Symposium on VLSI Circuits, Jun. 18, 2008, pp. 58-59.
Hidaka, et al., "A 4-Channel 1.25-10.3 Gb/s Backplane Transceiver Macro with 35 dB Equalizer and Sign-Based Zero-Forcing Adaptive Control", In IEEE Journal of Solid-State Circuits, vol. 44, No. 12, Dec. 2009, pp. 3547-3559.
Hidaka, et al., "A 4-Channel 10.3Gb/s Transceiver with Adaptive Phase Equalizer for 4-to-41dB Loss PCB Channel", In IEEE International Solid-State Circuits Conference Digest of Technical Papers, Feb. 20, 2011, 3 pages.
Bulzacchelli, et al., "A 78mW 11.1Gb/s 5-Tap DFE Receiver with Digitally Calibrated Current-Integrating Summers in 65nm CMOS", In IEEE International Solid-State Circuits Conference Digest of Technical Papers, Feb. 8, 2009, 3 pages.
Chen, et al., "A Scalable 3.6-to-5.2mW 5-to-10Gb/s 4-Tap DFE in 32nm CMOS", In IEEE International Solid-State Circuits Conference Digest of Technical Papers, Feb. 8, 2009, 2 pages.
Fiedler, Alan, "High-Speed I/O Data Systems", U.S. Appl. No. 13/170,444, filed Jun. 28, 2011, 34 pages.
Fiedler, Alan, "Serializing Transmitter", U.S. Appl. No. 13/170,585, filed Jun. 28, 2011, 21 pages.
Kim, et al. "A 3.4Gbps transmitter for multi-serial data communication using pre-emphasis method", In Proceedings of 4th WSEAS International Conference on Circuits, Systems, Signal and Telecommunications, Jan. 27, 2010, pp. 153-156.
Keezer, et al., "Low-Cost 20 Gbps Digital Test Signal Synthesis Using SiGe and InP Logic", Journal of Electronic Testing, vol. 26, Issue 1, Feb. 2010, pp. 87-96.
Kumar, et al. "A family of 45nm IA processors", In Proceedings of the 2009 International Solid-State Circuits Conference, IEEE, Feb. 9, 2009, pp. 58-59.
US Patent and Trademark Office, Notice of Allowance issued in U.S. Appl. No. 13/170,585, Nov. 26, 2012, 7 pages.
US Patent and Trademark Office, Office Action issued in U.S. Appl. No. 13/170,585, Oct. 12, 2012, 7 pages.
Stratix II GX Device Handbook, vol. 1, Altera Corporation, Aug. 2007, 316 pages.
US Patent and Trademark Office, Supplemental Notice of Allowance issued in U.S. Appl. No. 13/170,585, Mar. 14, 2013, 2 pages.
Young, "Introducing Intel's chip-to-chip optical I/O interconnect technology", DeviceForge.corn, Apr. 2, 2004, 5 pages.
HyperTransport I/O Link Specification, Revision 3.10c, HyperTransport Technology Consortium, May 6, 2010, 22 pages.
PCI Express Base Specification Revision 3.0, PCI Express, Nov. 10, 2010, 860 pages. (Submitted in three parts).
IPEA European Patent Office, Second Written Opinion issued in PCT Application No. PCT/US2015/047630, May 2, 2016, WIPO, 9 pages.
ISA European Patent Office, International Search Report and Written Opinion Issued in Application No. PCT/US2015/047630, Nov. 26, 2015, WIPO, 15 pages.
IPEA European Patent Office, International Preliminary Report on Patentability Issued in PCT Application No. PCT/US2015/047630, Aug. 2, 2016, WIPO, 10 pages.

\* cited by examiner

MULTI-PHASE CLOCK GENERATION

BACKGROUND

High-speed I/O (input/output) data circuits for transferring large volumes of data at high speeds across short distances may suffer from various performance issues. For example, specifications for many commonly used I/O interfaces may be general purpose designs that attempt to meet a wide-range of design constraints, and are not optimal for any one design. Further, I/O data circuits that utilize packet-based communication may have large memory requirements and may come with a significant latency penalty.

SUMMARY

Embodiments are disclosed that relate to multi-phase clock generators for use in high speed I/O circuitry. One disclosed example provides a multi-phase clock generator comprising a delay line having a plurality of delay elements, the delay line being configured to receive an input clock signal and output a plurality of output clock signals having different phases compared to a phase of the input clock signal. The multi-phase clock generator further includes a control circuit configured to control the delay line based at least in part upon rising edges and falling edges of one or more output clock signals output at one or more locations along the delay line.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

In order to maintain synchronization while transmitting signals between electronic components (e.g., system-on-chip [SoC] components, processing cores, etc.), clock signals may be forwarded between the electronic components. In contrast with a phase locked loop (PLL) or an injection locked oscillator (ILO), a delay-locked loop (DLL) may offer enhanced jitter tracking performance and lower self-generated jitter, as a DLL propagates an input signal down a line of delay elements and does not accumulate or integrate input signal jitter over time. Thus, examples are disclosed that relate to the use of DLL circuits to generate multi-phase clock signals for a data sampler at a receiver side of an I/O system. Further, as minimization of phase spacing error in output clock signals from a DLL may be more complicated than with a PLL, examples are disclosed that measure both rising and falling signals at the output of a voltage-controlled delay line to at least reduce or minimize phase spacing error.

Figure 1:
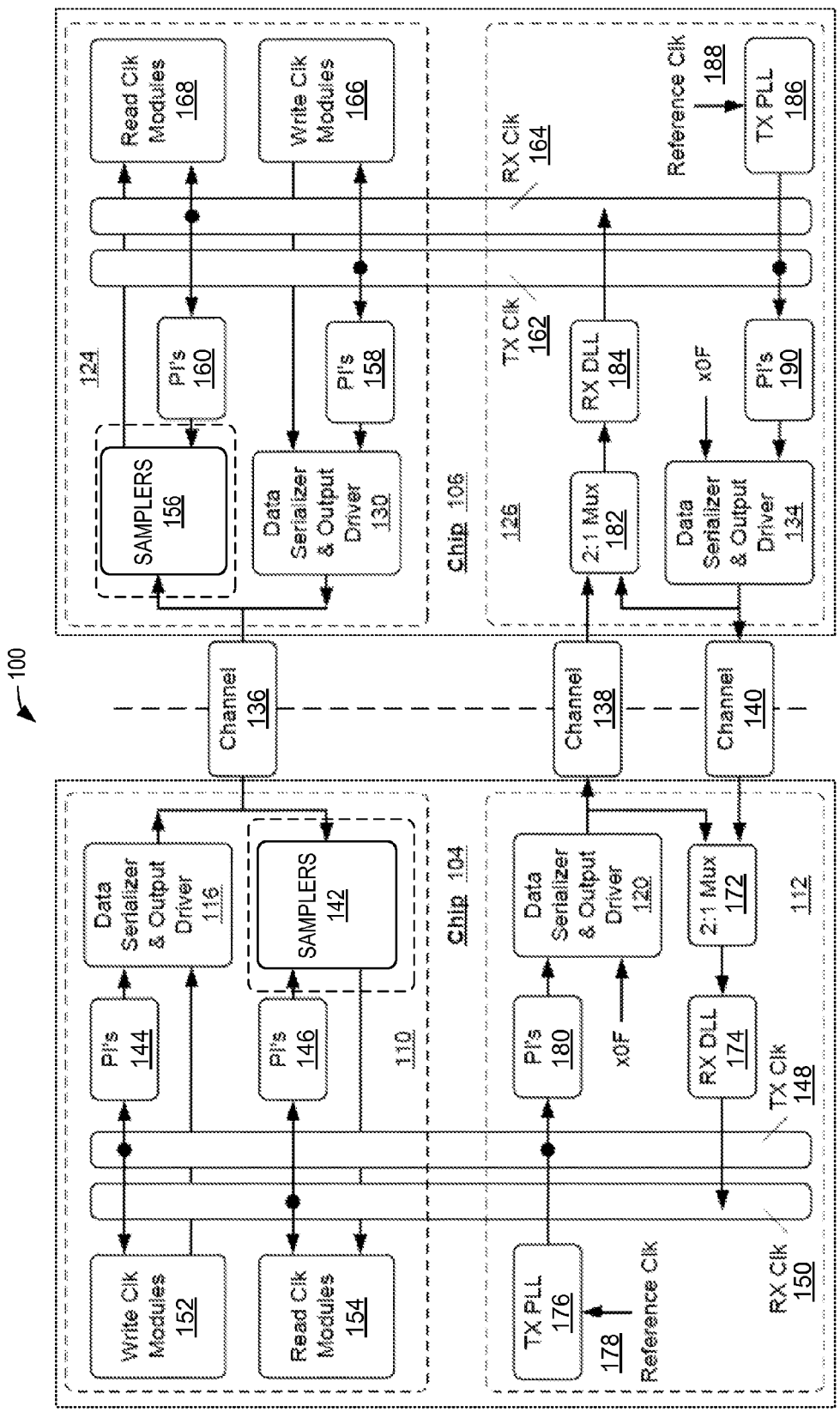
FIG. 1 shows a block diagram of an example high-speed I/O data system.

Prior to discussing example DLL circuitry, an example high-speed I/O data system 100 is described with reference to FIG. 1. System 100 includes a first chip 104 having a data circuit 110 and clock circuit 112, and a second chip 106 having a data circuit 124 and clock circuit 126. It is to be understood that chips 104 and 106 may represent any suitable electrical component(s), such as microchips, processing cores, and other circuit elements.

Data circuit 110 comprises a data serializer and an output driver 116, and data circuit 124 also comprises a data serializer and output driver 130. The data circuit 110 and clock circuit 112 of the first chip 104, and the data circuit 124 and clock circuit 126 of the second chip 106 form a chip-to-chip I/O data interface via data channels 136, 138, and 140.

System 100 includes data channel 136 for data communication between the data serializer and output driver 116 of the first data circuit 110 and the data serializer and output driver 130 of the second data circuit 124. Data channel 136 may be implemented as a bi-directional data channel, or may have any other suitable implementation. System 100 includes unidirectional clock data channels 138 and 140 for transmitting clock signals between the first chip 104 and the second chip 106.

The data circuit 110 of the first chip 104 also includes samplers 142, a transmitter clock phase interpolator 144, a receiver clock phase interpolator 146, a transmitter clock distribution 148, and a receiver clock distribution 150. The data circuit 110 further includes write clock modules 152 and read clock modules 154. Likewise, the data circuit 124 of the second chip 106 includes samplers 156, a transmitter clock phase interpolator 158, a receiver clock phase interpolator 160, a transmitter clock distribution 162, and a receiver clock distribution 164. The data circuit 124 further includes write clock modules 166 and read clock modules 168.

Receiver clock distribution 150 and 164 provide a multi-phase clock signal to samplers 142 and 156, via receiver clock phase interpolators 146 and 160, to enable the sampling of data signals received across channel 136. Examples of circuitry for generating multi-phase clock signals are described in more detail below.

The clock circuit 112 of the first chip 104 is configured to receive clock signals from clock circuit 126 via a multiplexer 172, and to generate, via a delay locked loop (RX DLL) 174, a multi-phase clock signal from the received clock signals. Multiplexers, such as multiplexer 172, may be used in the circuits for production test and/or for mission-mode operation. The multiplexer enables the use of the locally generated transmit clock (e.g., the clock coupled to channel 138) in place of the incoming receive clock (e.g., via channel 140).

The multi-phase clock signal generated by RX DLL 174 is then provided to samplers 142 via the receiver clock distribution 150 and the receiver clock phase interpolator 146. The illustrated clock circuit 112 also includes a data transmission clock generator comprising a transmitter phase locked loop (TX PLL) 176 receiving clock data from a reference clock 178, clock phase interpolator 180, and the above-mentioned data serializer and output driver 120. Clock circuit 112 interfaces with clock circuit 126 via channels 138 and 140.

As described above, the data circuit 124 of the second chip 106 is symmetric to the data circuit 110 of first chip 104. Similarly, the clock circuit 126 of the second chip 106 is symmetric to the clock circuit 112 of the first chip 104. Thus, the clock circuit 126 of the second chip 106 includes a receiver clock circuit comprising a multiplexer 182 and DLL 184 to generate a multi-phase clock signal for samplers 156 via receiver clock distribution 164 and receiver clock phase interpolators 160. The clock circuit 126 also includes a transmitter clock circuit comprising a transmitter phase locked loop (PLL) 186 that receives a reference clock input 188, phase interpolators 190, and a data serializer and output driver 134 to provide a clock signal for data transmission.

As mentioned above, the use of a PLL or ILO to generate multi-phase receiver clock signals for data samplers based at least in part upon a clock signal received across channels 138 and/or 140 may suffer from difficulties in jitter tracking and other issues. In contrast, the use of DLLs 174 and 184 may offer better jitter tracking performance. However, accurately controlling phase spacing between the clock signals may be more difficult with a DLL than with a PLL or ILO.

Figure 2:
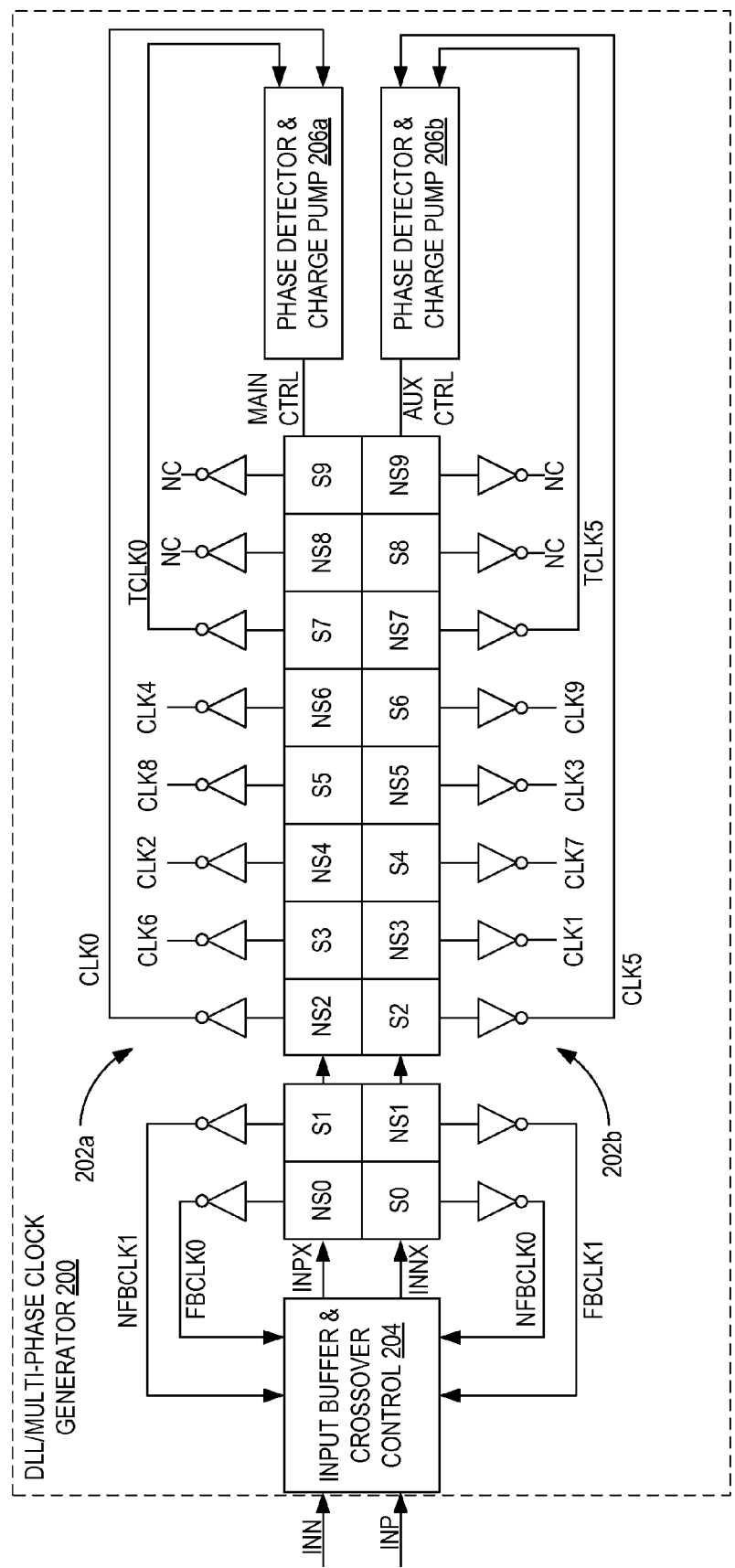
FIG. 2 shows a block diagram of an example multi-phase clock generator comprising a delay-locked loop for generating multi-phase clock signals.

Accordingly, FIG. 2 illustrates an example delay-locked loop (DLL) suitable for use as DLLs 174 and 184 for generating multi-phase clock signals. The depicted DLL also may be referred to herein as multi-phase clock generator 200. The multi-phase clock generator 200 includes one or more delay lines, illustrated in FIG. 2 as delay line 202a and delay line 202b. While two delay lines are shown, other implementations may utilize a different number of delay lines.

Each delay line has a plurality of delay elements, illustrated collectively for the two lines as blocks S2-S9 and NS2-NS9, and is configured to output a plurality of output clock signals having different phases compared to the phase of the input clock signal. Delay lines 202a and 202b are arranged in electrically parallel paths and comprise complementary pairs of delay elements. The clock outputs of multi-phase clock generator 200 (e.g., one or more of clk0-clk9) are provided to samplers 156 of chip 106 (e.g. one clock output per sampler) to enable incoming signals to be sampled. By producing 10 clock signals via the multi-phase clock generator, the clock signals INN and INP enter the multi-phase clock generator at 1/10th the rate of the data signal entering the sampler.

The clock signals INN and INP as received may have crossover error, in that clock signal INN and complementary clock signal INP may not at the same time cross over the midpoint between logic high and logic low levels. In this case, the INN and INP signals may either cross each other high (e.g., closer to a peak of signals) or low (e.g., closer to a trough of the signals). Crossover error may result from errors caused by circuit elements in the clock transmitter from which the clock signals INN and INP are received, and may impact the timing between output clock signals generated by the multi-phase clock generator 200. As such, the clock signals INN and INP are first provided to an input buffer and crossover control block/module 204 configured to reduce the crossover error. Adjusted clock signals INNX and INPX are then output to the delay line(s) and/or the delay elements electrically connected to the delay lines.

The input buffer and crossover control block 204 may adjust the received complementary clock signals INN and INP in any suitable manner. For example, the depicted input buffer and crossover control block 204 adjusts the clock signals INN and INP based at least in part upon feedback received from the first two blocks electrically connected to each delay line (e.g., fbclk0, nfbclk1, fbclk1, and nfbclk0). In other implementations, other blocks (e.g., delay elements in the delay lines, such as one or more of blocks S2-S9 and/or NS2-NS9) may be utilized for feedback in addition to and/or as an alternative to one or more of the above-described blocks. These feedback signals (e.g., fbclk0, nfbclk0, fbclk1, and nfbclk1) are filtered and converted to DC voltages in the crossover control block such that only the information for influencing crossover control (e.g., the crossover point of fbclk0 and nfbclk0 and the crossover point of fbclk1 and nfbclk1) is maintained, as described in more detail below with respect to FIGS. 6 and 9. Input buffer and crossover control block 204 adjusts the crossover error of feedback signals fbclk0 and nfbclk0 such that it is substantially equal to the crossover error of feedback signals fbclk1 and nfbclk1, and this in turn leads to a crossover error of adjusted clock signals INNX and INPX that is substantially equal to zero in this embodiment.

Further control of the outputs of the delay lines 202a and 202b is provided by the phase detector and charge pump blocks 206a and 206b, which control the delay lines based at least in part upon the measured rising and falling edges of one or more output clock signals output at one or more locations along the delay lines. The phase detector and charge pump blocks receive signals from delay elements both earlier in the delay line (e.g., NS2 and S2) and later in the delay line (e.g., S7 and NS7).

In the depicted example, phase detector and charge pump 206a measures the relative phase of signals tclk0 (terminal clock 0, output from delay element S7) and clk0 (clock 0, output from delay element NS2) and sets a voltage proportional to this relative phase on main control signal MAIN CTRL. Negative feedback enables-the delay-locked loop to lock such that the tclk0 and clk0 signals align and have substantially equal phase. Similarly, phase detector and charge pump 206b measures the relative phase of signals tclk5 and clk5 and sets a voltage proportional to this relative phase on auxiliary control signal AUX CTRL. Negative feedback enables the delay-locked loop to lock such that the tclk5 and clk5 signals align and have substantially equal phase. In this way, multi-phase clock generator 200 maintains phase accuracy of both rising and falling edges.

As described in more detail below with respect to FIG. 6, the main control and auxiliary control signals are provided to each of the delay elements to control a respective subset of gates of the transistors in the delay elements. In some examples, main control may be connected to more transistors than auxiliary control. In other examples, main control may be connected to a same number of transistors in the delay elements as the auxiliary control, or to a lesser number of transistors.

The delay lines 202a and 202b are configured such that the relative phases of the clock signals in delay line 202a and the corresponding clock signals in delay line 202b are substantially similar. The phase detector and charge pumps 206a and 206b thus are utilized to detect and substantially correct errors in the relative phases of tclk0 and clk0, and of tclk5 and clk5.

Figure 3:
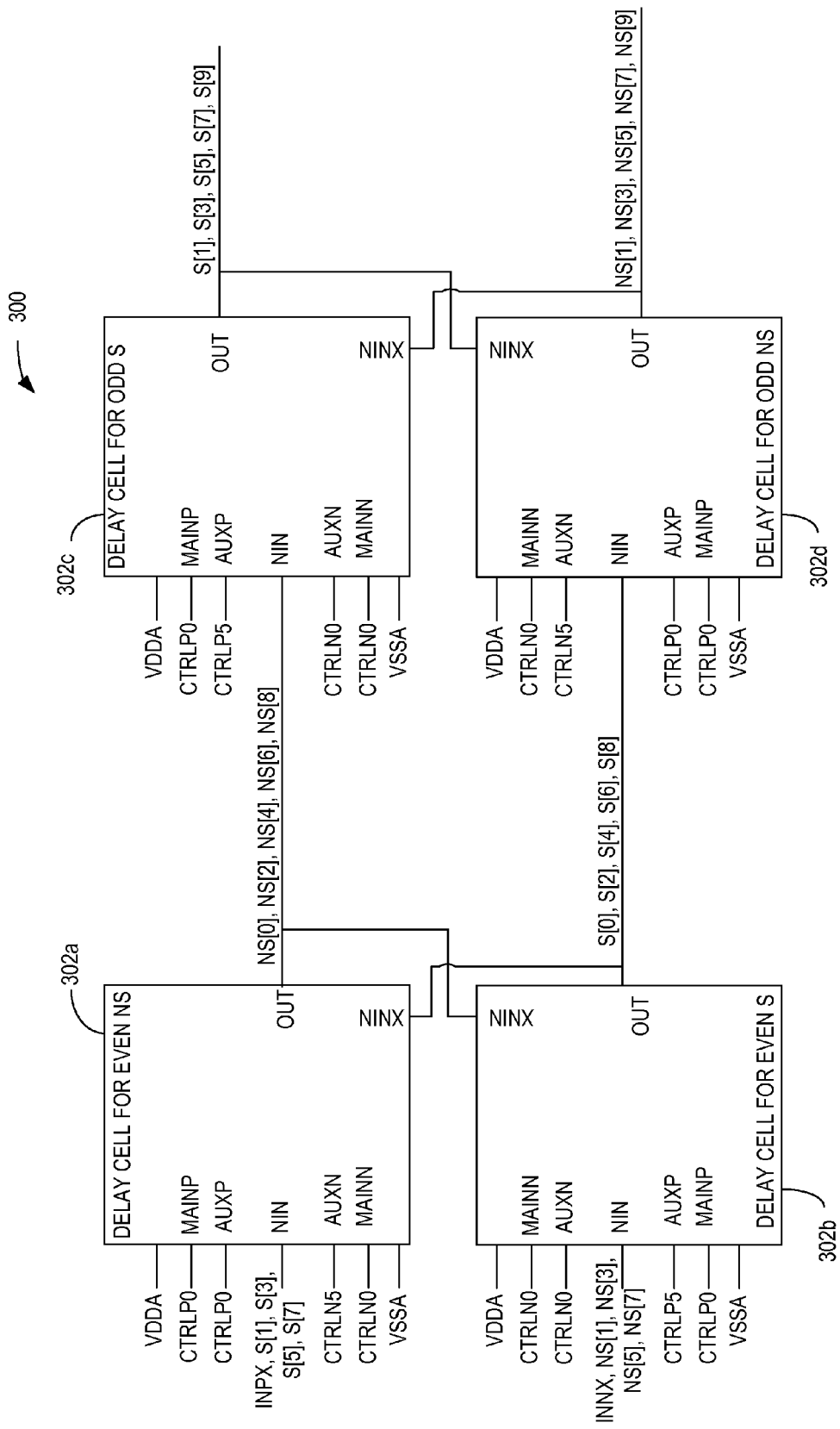
FIG. 3 shows example delay elements of the multi-phase clock generator of FIG. 2.

In some examples, complementary delay elements in delay line 202a and delay line 202b may be cross-coupled, as described in more detail with respect to FIG. 3. In such examples, the main control signal and auxiliary control signal may be connected respectively to delay line 202a and delay line 202b, rather than connecting the main control signal to both delay lines and the auxiliary control signal to both delay lines. In other examples, the main control and auxiliary control signals each may be provided to both delay line 202a and delay line 202b, whether or not complementary delay elements are cross-coupled. Although illustrated as two blocks, it is to be understood that the phase detector and charge pump blocks 206a and 206b may be implemented as a single circuit in some examples.

FIG. 3 shows an example schematic 300 for delay elements S0-9 and NS0-9 of the multi-phase clock generator 200 of FIG. 2. Block 302a represents the delay elements having even NS labels in FIG. 2 (e.g., NS0, NS2, NS4, NS6, and NS8), and block 302b represents the delay elements having even S labels (e.g., S0, S2, S4, S6, and S8). Further, block 302c represents the delay elements having odd S labels (e.g., S1, S3, S5, S7, and S9), while block 302d represents the delay elements having odd NS labels (e.g., NS1, NS3, NS5, NS7, and NS9). As illustrated in FIG. 2, each delay element receives input either from the input buffer and crossover control block 204 (e.g., as shown for NS0 and S0) or from an immediately prior delay element. Accordingly, the inputs of each even delay element reflected at the NIN input port are associated with a corresponding output at the OUT output port (e.g., INPX is the input for the delay element that outputs NS0, S1 is the input for the delay element that outputs NS2, etc.).

As described above, in some examples, each delay element may receive input of the main control signal and auxiliary control signal. Mainp (or ctrlp0) controls an output rising delay, while mainn (or ctrln0) controls an output falling delay. Similarly, auxp (or ctrlp5) controls an output rising delay, while auxn (or ctrln5) controls an output falling delay.

As further illustrated, the outputs of each even delay element from delay line 202a are coupled to the outputs of each even delay element from delay line 202b via the XNIN input on each delay element. Similarly, the outputs of each odd delay element from delay line 202a are coupled to the outputs of each odd delay element from delay line 202b via the corresponding XNIN input on each delay element. This provides for the cross-coupling of the two delay lines, as mentioned above with respect to FIG. 2.

Figure 4:
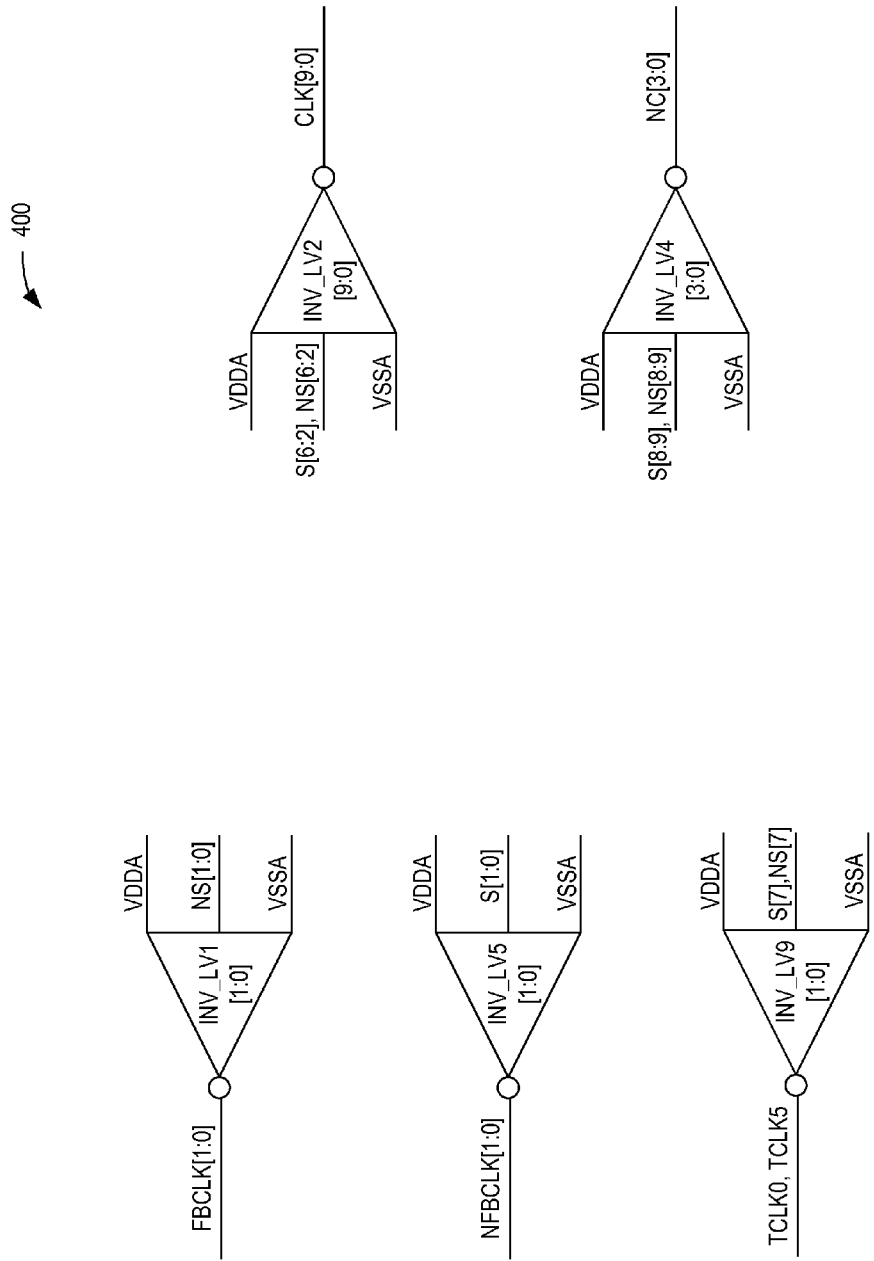
FIG. 4 shows example inverters for inverting the output of the delay elements from the multi-phase clock generator of FIG. 2.

FIG. 4 illustrates an example schematic diagram 400 for the inverters connected to the clock output of each delay element of FIG. 2. Inverter IN_LV1 represents the inverters connected to NS0 and NS1, which respectively output fbclk0 and fbclk1 for NS0 and NS1. Similar indicia designate the locations of the other inverters. For example, inverter INV_LV2 corresponds to the inverters connected to S2-S6 and NS2-NS6, which output the clock signals clk0-clk9 for controlling the data samplers.

Figure 5:
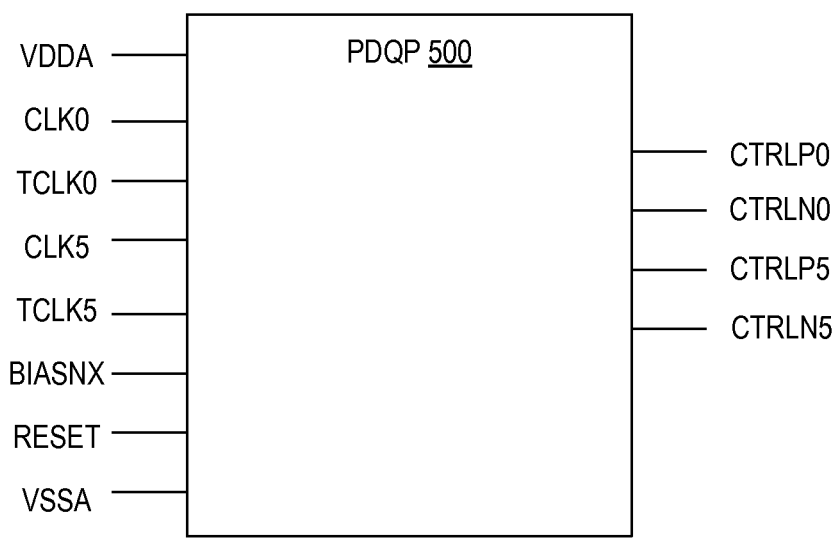
FIG. 5 shows an example of the phase detection and charge pump block of FIG. 2.
Figure 6:
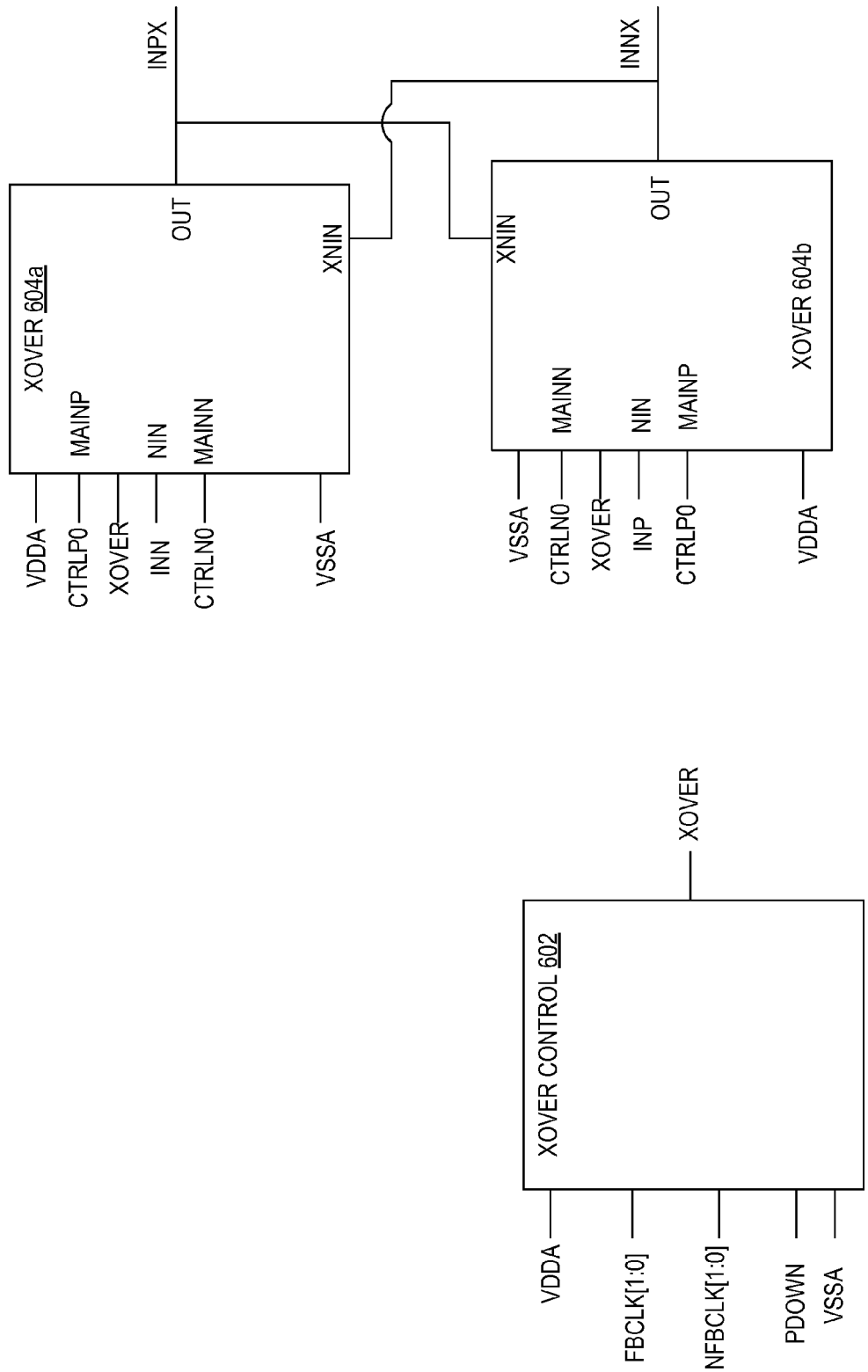
FIG. 6 shows an example of the input buffer and crossover control block of FIG. 2.

FIGS. 5 and 6 illustrate example schematic diagrams for the phase detector and charge pump 206a/206b of FIG. 2 (PDQP circuit 500 in FIG. 5) and the input buffer and crossover control block 204 of FIG. 2 (XOVER CONTROL circuit 602 and XOVER circuits 604a and 604b in FIG. 6). The PDQP 500 receives inputs from tclk0, clk0, tclk5, and clk5 (as described above with respect to FIG. 2) and output control signals ctrlp0, ctrln0, ctrlp5, and ctrln5 utilized as the main control signals and auxiliary control signals, respectively.

The XOVER CONTROL circuit 602 of FIG. 6 receives feedback clocks and complementary feedback clocks (e.g., fbclk0, fbclk1, nfbclk0, and nfbclk1) and outputs an XOVER output signal indicating relative crossover points of the feedback clocks to control the XOVER circuits 604a and 604b. The XOVER circuit receives respective complementary transmitted clock input signals as input (e.g., XOVER 604a receives the INN signal illustrated in FIG. 2, while XOVER 604b receives the complementary INP signal illustrated in FIG. 2), and outputs adjusted clock signals INNX or INPX based on control signals received from PDQP (e.g., ctrlp0/mainp and ctrln0/mainn) and XOVER CONTROL (e.g., XOVER). As illustrated, the outputs of each XOVER circuit are coupled to the other XOVER circuit via an XNIN input to provide cross-coupling between delay lines.

Figure 7:
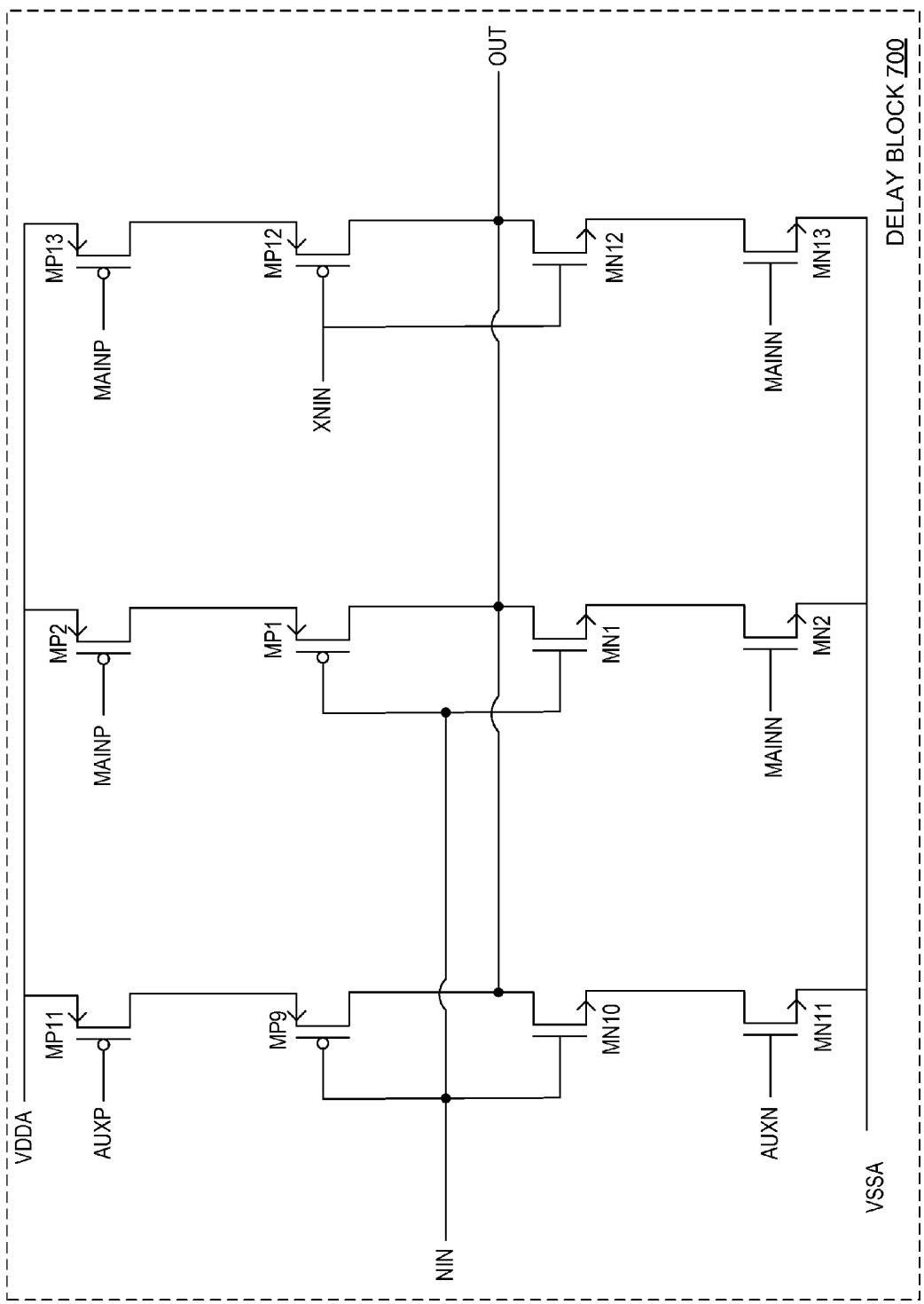
FIG. 7 shows an example circuit diagram for the delay element of FIG.

FIG. 7 shows an example circuit diagram for a voltage-controlled delay element 700, such as those of FIGS. 2 and 3. For example, delay element 700 may correspond to any of delay elements 302a-302d of FIG. 3. NIN represents the output of input buffer and crossover control block 204 of FIG. 2, and XNIN provides the cross-coupling from delay elements of another delay line. The diagram illustrated in FIG. 7 is an example of a current-starved inverter. In some examples, transistors that are connected to XNIN may be weaker than other transistors.

As shown, four transistors (MP2, MP13, MN2, and MN13) have a gate coupled to a main control input (e.g., mainp or mainn), compared to two transistors (MP11 and MN11) that have a gate coupled to an auxiliary control input. Accordingly, the main control input provides approximately two thirds of the control, while the auxiliary control input provides approximately one third of the control in this example. It is to be understood that any suitable ratio of main control to auxiliary control may be utilized without departing from the scope of this disclosure.

Figure 8:
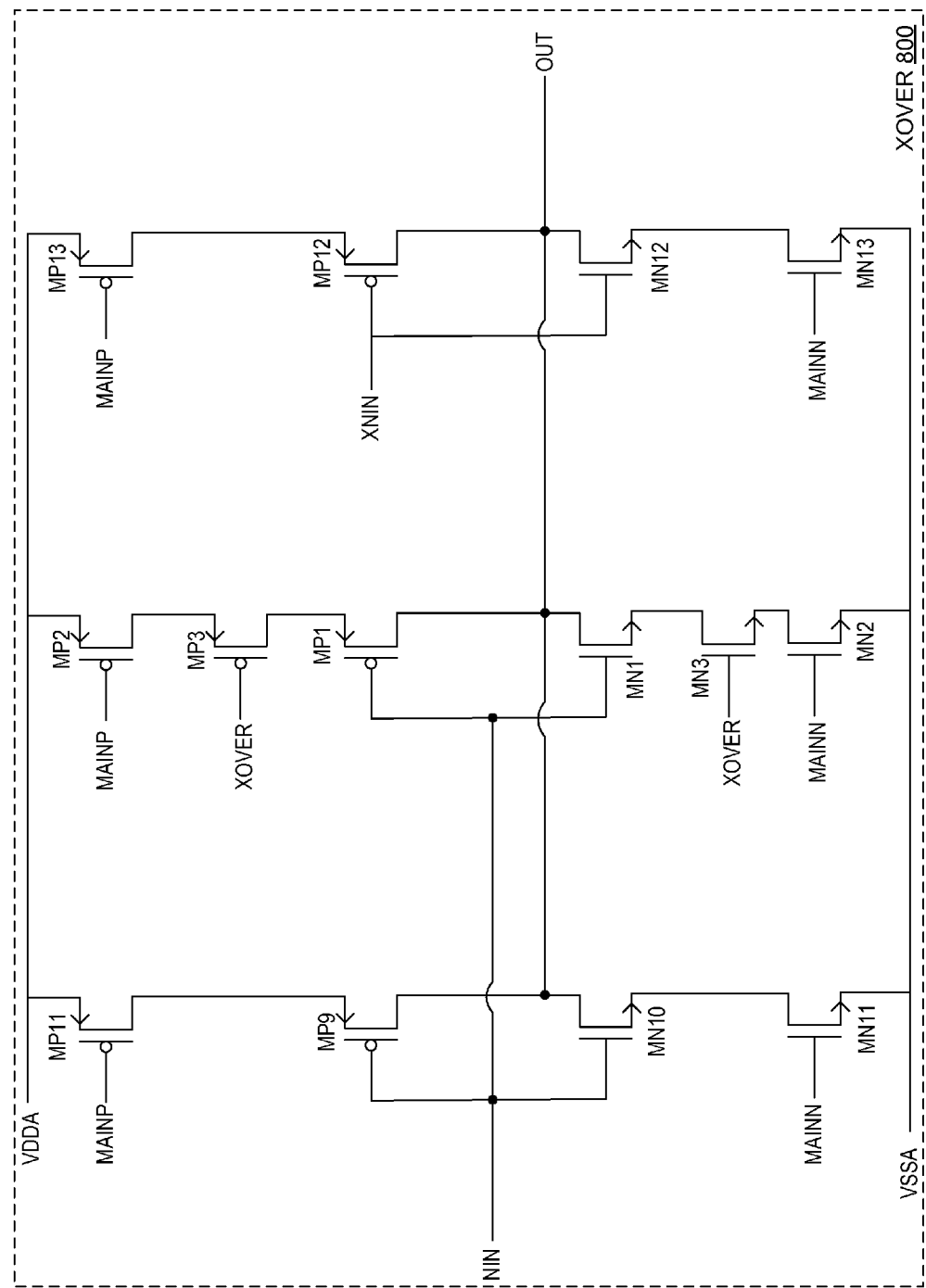
FIG. 8 shows an example circuit diagram for the crossover block circuit of FIG. 6.

FIG. 8 illustrates an example circuit diagram of an XOVER circuit 800, such as XOVER circuit 604a/604b of FIG. 6. Similarly to the delay element illustrated in FIG. 7, the XOVER circuit performs similarly to a current-starved inverter. Mainp controls the output rising delay, mainn controls the output falling delay, and the XOVER input (e.g., to transistor MP3) controls both delays in a complementary fashion.

Figure 9:
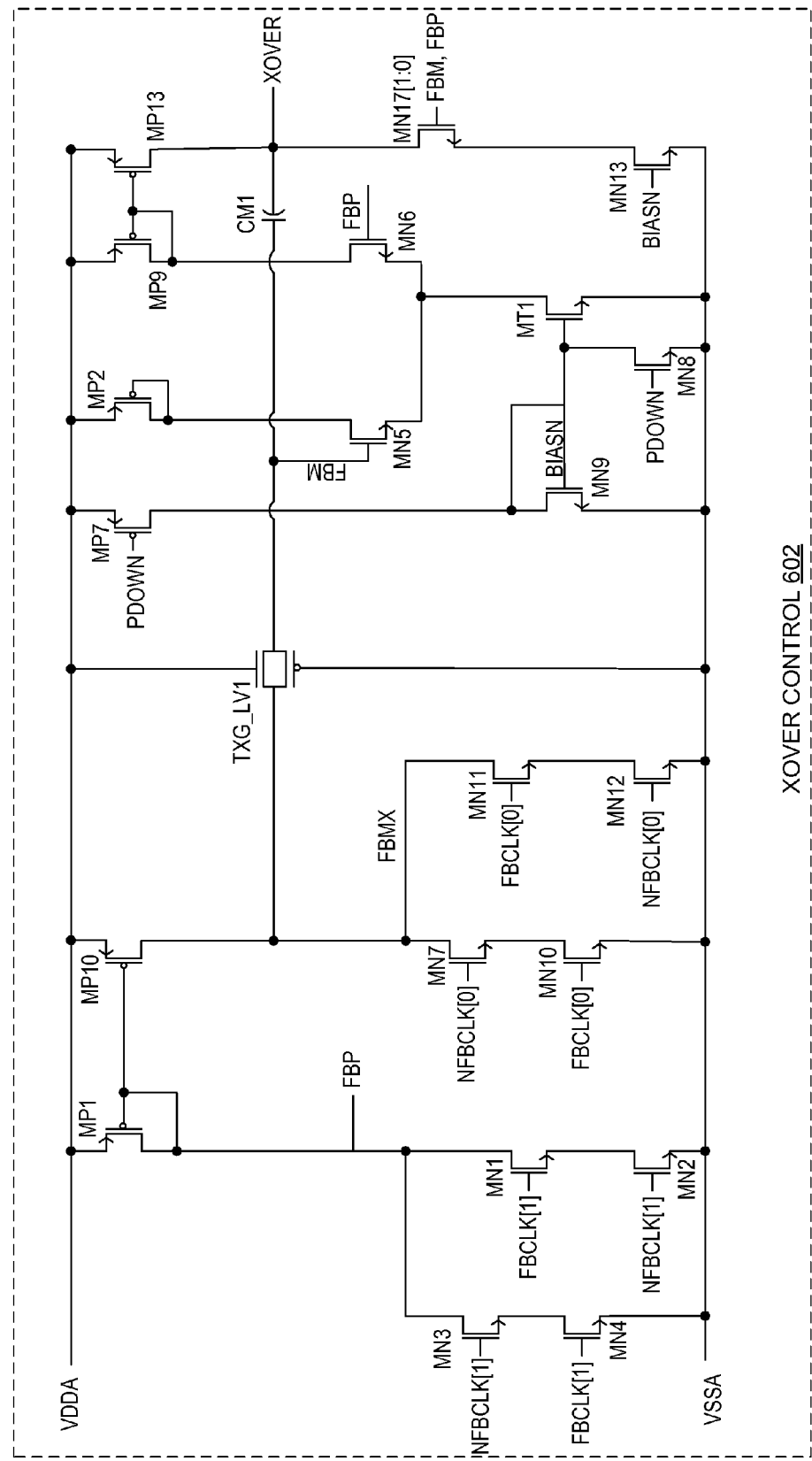
FIG. 9 shows an example circuit diagram for the crossover control block of FIG. 6.

FIG. 9 illustrates an example circuit diagram of XOVER CONTROL circuit 602 of FIG. 6. As illustrated, the four transistors in lower left corner (e.g., MFETs MN1-4) operate similarly to an XOR gate. The eight MFETs in the lower left corner of the figure (e.g., MFETs MN1-4 and MN7 and MN10-12) are utilized to measure the crossover points of the feedback clocks (e.g., to determine if the clocks crossover high/crossover low). If the fbclk0 and nfbclk0 cross over high, fbclk1 and nfbclk1 will crossover low. This control loop adjusts the crossover points until the crossover point of fbclk0 and nfbclk0 is substantially the same as the crossover point fbclk1 and nfbclk1. The four MFETs on the left (MN1-4) are fbclk/nfbclk1s and the four MFETs on the right (MN7 and MN10-12) are fbclk/nfbclk0s. When the crossover points of each set of feedback clocks are substantially equal, the aggregate pull-down current of the four corresponding transistors (e.g., MN1-4 for fbclk1/nfbclk1 and MN7/MN10-12 for fbclk0/nfbclk0) is substantially equal to the aggregate pull-down current of the other four transistors. When the aggregate pull-down currents are substantially equal, the voltage at FBMX is steady state (e.g., at stable operating point, neither rising nor falling). FBMX is coupled to gate TXG_LV1 and amplified via the inverting amplifier (with feedback compensation) provided by the components to the right of TXG_LV1 in FIG. 9, resulting in the inverted and amplified FBMX being output as the XOVER output signal. In this way, t the crossover control module varies a voltage output as the first signal crossover point deviates from the second signal crossover point, and provides a steady-state voltage output when the first signal crossover point is substantially equal to the second signal crossover point.

Referring to FIG. 8, in an example scenario, when XOVER is a high voltage, MN3 is stronger and MP3 is weaker. In this case, the output of the input buffer and crossover control block OUT falls faster than it rises. Accordingly, the signals provided delay elements NS0 and S0 crossover low, and outputs from NS0 and S0 (e.g., fbclk0 and nfbclk0 of FIG. 2) crossover high. Since the outputs of NS0 and S0 are inverted to formfbclk0 and nfbclk0, the crossover point of these signals is low. If the crossover point of fbclk0 and nfbclk0 is low, a low pull down current exists on FBMX, causing FBMX to pull up, going high. Due to the inverting amplifier illustrated in FIG. 9, FBMX will be inverted and output as XOVER at a low voltage. Accordingly, this feedback enables the response to an XOVER output that is high to pull down the XOVER output.

Figure 10:
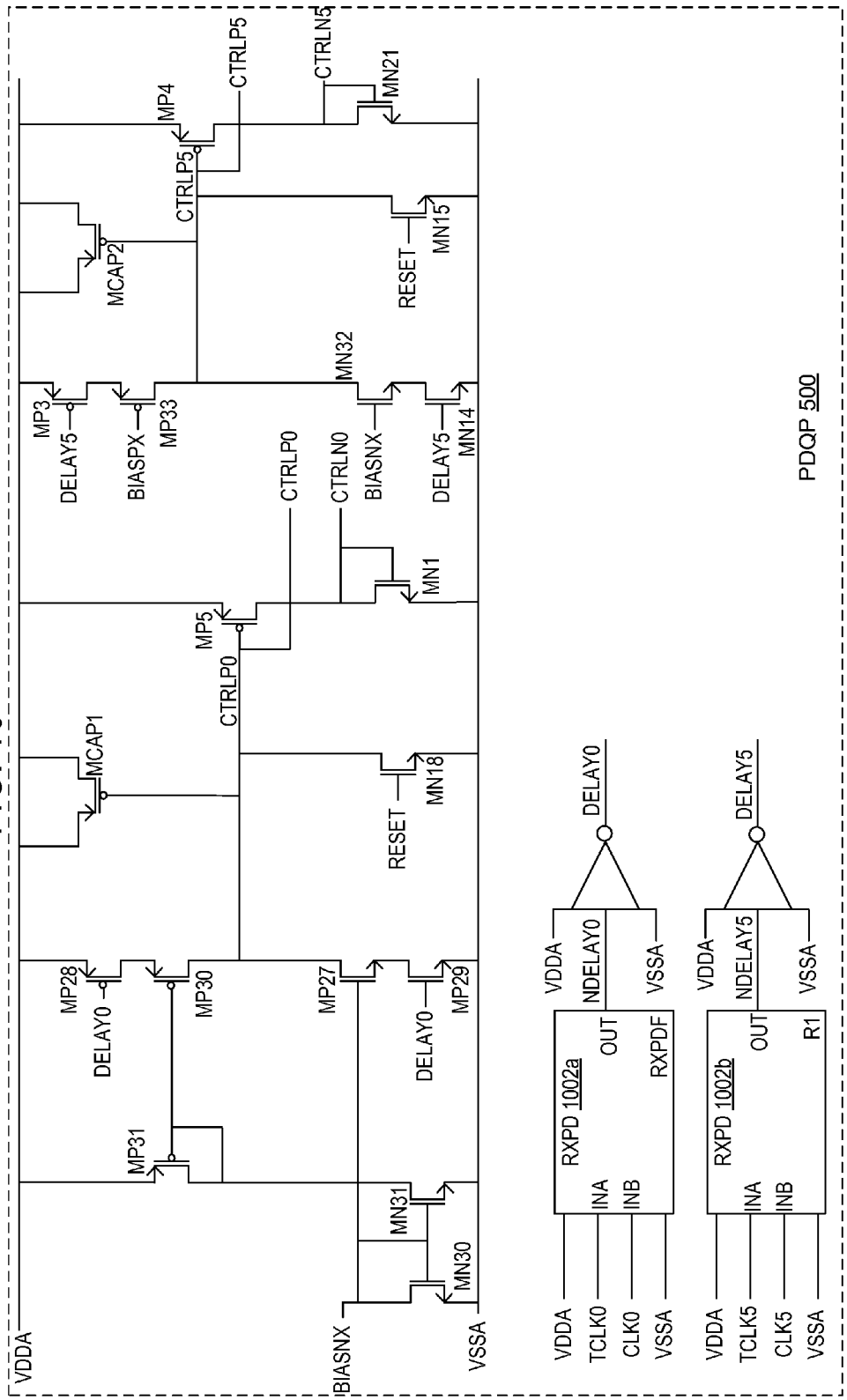
FIG. 10 shows an example circuit diagram for the phase detection and current pump blocks of FIG. 5.

FIG. 10 illustrates an example circuit diagram for phase detection and charge pump circuit PDQP 500 of FIG. 5. PDQP includes RXPD circuits 1002a and 1002b, which include phase detectors illustrated in more detail in FIG. 11. The RXPD circuits compare the relative edge positioning of tclk and clk signals (e.g., RXPD 1002a compares tclk0 and clk0, while RXPD 1002b compares tclk5 and clk5) and output a voltage to serve as a delay signal. The output voltage is high if the respective terminal clock (e.g., tclk0/tclk5) leads the clock signal (e.g., clk0/clk5), and low if the terminal clock signal trails the clock signal. The phase detection charge pump, illustrated above the RXPD circuits, generates an output current depending on whether the delay signals are high or low. For example, the delay signals may be input to switches MP28 and MN29, which are enabled on or off depending upon whether the delay is high or low. The switches selectively short the sources of MP30/MN27, respectively, which are biased such that, when the sources are grounded, the transistors conduct a small amount of current onto or off of the ctrlp0 node. Further, a filter capacitor (MCAP1) may be provided on the output of the charge pump. Ctrlp0 may go to mainn or auxp based on whether the example circuit is utilized in the phase detection and charge pump block 206a of FIG. 2 or the phase detection and charge pump block 206b of FIG. 2 (e.g., utilized in the main or auxiliary control path/block).

A current mirror formed by MP5/MN1 is utilized to generate ctrln0. Ctrln0 is provided to either mainn or auxn, depending on the block in which the circuit is utilized. The generation of ctrlp5 and ctrln5 is performed similarly to ctrlp0 and ctrln0, with ctrlp5 and ctrln5 providing the auxiliary control signal and ctrlp0/ctrln0 providing the main control signal.

Figure 11:
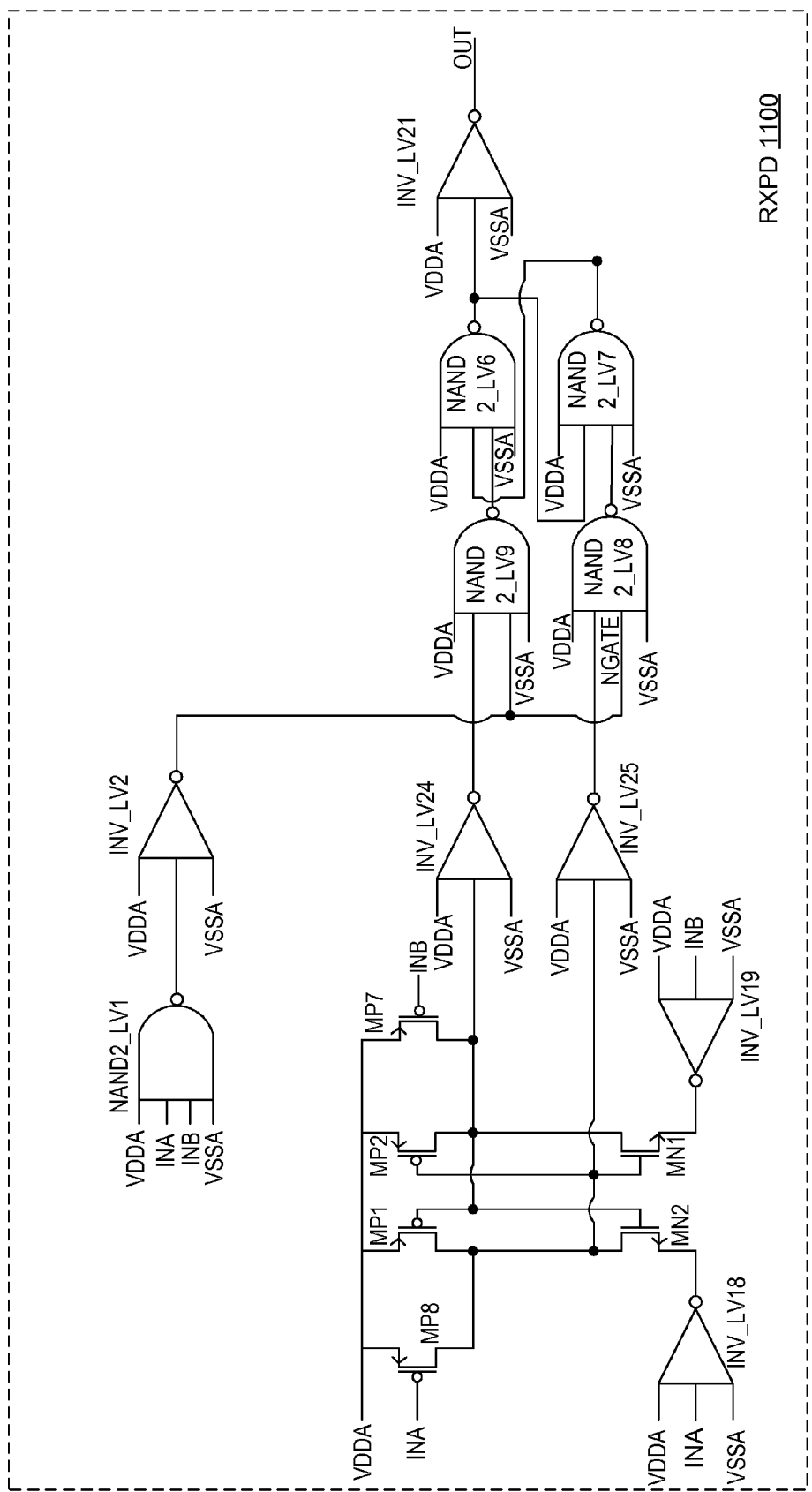
FIG. 11 shows an example circuit diagram for a phase detection circuit of FIG. 10.

FIG. 11 illustrates an example circuit diagram of a phase detector RXPD 1100. Phase detector 1100 is utilized in the RXPD circuit 1002a or 1002b of FIG. 10 to generate a logic signal indicating whether the edges of the associated tclk/clk signals are early or late.

Another example provides a device comprising a delay line having a plurality of delay elements, the delay line being configured to receive an input clock signal and output to a sampler circuit a plurality of output clock signals having different phases compared to a phase of the input clock signal, and a control circuit configured to control the delay line based at least in part upon rising edges and falling edges of one or more output clock signals output at one or more locations along the delay line. In such an example, the delay line may be a first delay line, the plurality of delay elements may be a first plurality of delay elements, and the plurality of output clock signals may be a first plurality of output clock signals, and the multi-phase clock generator may additionally or alternatively comprise a second delay line having a second plurality of delay elements, the second delay line being configured to receive a complement of the input clock signal and to output a second plurality of output clock signals. In such an example, the first delay line and the second delay line may additionally or alternatively be arranged in electrically parallel paths and may comprise complementary pairs of delay elements. In such an example, each complementary pair of delay elements may additionally or alternatively comprise two electrically parallel delay elements communicatively coupled to one another. In such an example, the device may additionally or alternatively include a crossover control module communicatively coupled to the delay line, the crossover control module being configured to receive clock signals from a clock signal source, receive output signals from a first delay element and a second delay element of the plurality of delay elements, the second delay element being complementary to the first delay element, utilize a signal crossover point for the output signals from the first delay element and the second delay element to determine a crossover error in the complementary clock input signals, and generate the input clock signal for the delay line using the crossover error. In such an example, the signal crossover point may be a first signal crossover point, and the crossover control module may additionally or alternatively be configured to utilize a second signal crossover point for output signals received from a third delay element and a fourth delay element of the plurality of delay elements, the fourth delay element being complementary to the third delay element. In such an example, the crossover control module may additionally or alternatively be configured to vary a control-signal voltage while the first signal crossover point is different from the second signal crossover point and to provide a steady-state control-signal voltage when the first signal crossover point is substantially equal to the second signal crossover point. In such an example, the control circuit may additionally or alternatively be configured to control the delay line based at least in part upon rising and falling edges of delay line output clock signals. In such an example, the device may additionally or alternatively be configured to provide the plurality of output clock signals to a sampler circuit. Any or all of the above-described examples may be combined in any suitable manner in various implementations.

Another example provides a device comprising a delay line having a plurality of delay elements, and a module electrically coupled to the plurality of delay elements and configured to receive complementary clock input signals from a clock signal source, receive a first output signal and a second output signal from, respectively, a first delay element and a second delay element of the plurality of delay elements, utilize a signal crossover point of the first output signal and the second output signal to determine a crossover error in the complementary clock input signals, and output adjusted complementary clock input signals to the delay line using the crossover error. In such an example, the delay line may be a first delay line, the plurality of delay elements may be a first plurality of delay elements, and the plurality of output clock signals may be a first plurality of output clock signals, and the multi-phase clock generator may additionally or alternatively comprise a second delay line having a second plurality of delay elements configured to receive a complement of the input clock signal and to output a second plurality of output clock signals. In such an example, the first delay line and the second delay line alternatively or additionally may be arranged in electrically parallel paths and comprise complementary pairs of delay elements. In such an example, the complementary pair of delay elements alternatively or additionally may be electrically coupled to one another. In such an example, the control circuit alternatively or additionally may be configured to control the first delay line and the second delay line based at least in part upon rising and falling edges of one or more output clock signals output at one or more locations along the first delay line and the second delay line. In such an example, the control circuit may alternatively or additionally be configured to output a first control signal for a first subset of electrical components in each delay element and a second control signal for a second subset of electrical components in each delay element. In such an example, the first control signal may alternatively or additionally be provided to a greater number of electrical components in each delay element than the second control signal. In such an example, the one or more locations along the first delay line and the second delay line may alternatively or additionally comprise one or more pairs of electrically parallel delay elements arranged at different locations along the first delay line and the second delay line. In such an example, the signal crossover point may be a first signal crossover point, and the crossover control module may alternatively or additionally be configured to utilize a second signal crossover point for output signals received from a third delay element and a fourth delay element of the plurality of delay elements. In such an example, the crossover control module may alternatively or additionally be configured to generate excess current to vary a control-signal voltage while the first signal crossover point is different from the second signal crossover point and to provide a steady-state control-signal voltage when the first signal crossover point is substantially equal to the second signal crossover point. Any or all of the above-described examples may be combined in any suitable manner in various implementations.

Another example provides a multi-phase clock generator comprising electrically parallel first and second delay lines having a plurality of complementary delay elements, an input buffer and crossover control module configured to receive a first source clock input signal and a second source clock input signal from a clock signal source, to receive feedback signals from the electrically parallel first and second delay lines, and to output to the electrically parallel first and second delay lines complementary clock input signals by determining crossover error in the first source clock input signal and the second complementary source input clock signal based at least in part upon the feedback signals received from the electrically parallel first and second delay lines, and a control circuit configured to control the delay line based at least in part upon rising and falling edges of one or more output clock signals output at one or more locations along the electrically parallel first and second delay lines. Any or all of the above-described elements may be combined in any suitable manner in various implementations.

The above-described examples may be used in combination with sampler circuitry to help enable the samplers to be clocked such that the relative phases are substantially equally distributed across 360 degrees, as the above-described example multi-phase clock generators may provide output signals having increased phase accuracy, and decreased jitter, insertion delay, and crossover error relative to other clock generators (e.g., clock generators using PLLs).

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A device, comprising:
   a first delay line having a plurality of delay elements, the first delay line being configured to receive a first input clock signal and output a first plurality of output clock signals having different phases compared to a phase of the first input clock signal;
   a second delay line having a plurality of delay elements, the second delay line being configured to receive a second input clock signal and output a second plurality of output clock signals having different phases compared to a phase of the second input clock signal;
   a control circuit configured to control the first and second delay lines based at least in part upon a rising or falling edge of at least one output clock signal of the first plurality of output clocks signals and at least one output clock signal of the second plurality of output clock signals; and
   a crossover control module communicatively coupled to the delay line, the crossover control module being configured to receive clock signals from a clock signal source, determine crossover error in the first and second delay lines, and generate the first input clock signal and the second input clock signal based on the crossover error.

2. The device of claim 1, wherein the second input clock signal is a complement of the first input clock signal.

3. The device of claim 2, wherein the first delay line and the second delay line are arranged in electrically parallel paths and comprise complementary pairs of delay elements.

4. The device of claim 3, wherein each complementary pair of delay elements comprises two electrically parallel delay elements communicatively coupled to one another.

5. The device of claim 1, wherein the crossover control module is configured to determine crossover error in the first and second delay lines by
   receiving output signals from a first delay element and a second delay element of the plurality of delay elements, the second delay element being complementary to the first delay element, and
   utilizing a signal crossover point for the output signals from the first delay element and the second delay element.

6. The device of claim 5, wherein the signal crossover point is a first signal crossover point, and wherein the crossover control module is further configured to utilize a second signal crossover point for output signals received from a third delay element and a fourth delay element of the plurality of delay elements, the fourth delay element being complementary to the third delay element.

7. The device of claim 6, wherein the crossover control module is configured to vary a control-signal voltage while the first signal crossover point is different from the second signal crossover point and to provide a steady-state control-signal voltage when the first signal crossover point is substantially equal to the second signal crossover point.

8. The device of claim 1, wherein the control circuit is configured to control the delay line based at least in part upon rising and falling edges of delay line output clock signals.

9. The device of claim 1, wherein the device is configured to provide the plurality of output clock signals to a sampler circuit.

10. A device, comprising:
a first delay line having a first plurality of delay elements;
a second delay line having a second plurality of delay elements, the first delay line and the second delay line being in electrically parallel paths and forming pairs of delay elements; and
a module electrically coupled to the first delay line and the second delay line and configured to:
receive complementary clock input signals from a clock signal source,
receive a first pair of output signals from a first pair of delay elements,
utilize a signal crossover point of the first pair of output signals to adjust a crossover point in the complementary clock input signals to form adjusted complementary clock input signals, and
output the adjusted complementary clock input signals to the first and second delay lines.

11. The device of claim 10, wherein the module is further configured to receive a second pair of output signals from a second pair of delay elements, and to adjust the crossover point based upon the first pair of output signals and the second pair of output signals.

12. The device of claim 11, further comprising a control circuit configured to control the first delay line and the second delay line based at least in part upon rising and falling edges of one or more output clock signals output at one or more locations along the first delay line and the second delay line.

13. The device of claim 12, wherein the control circuit is configured to output a first control signal for a first subset of electrical components in each delay element and a second control signal for a second subset of electrical components in each delay element.

14. The device of claim 13, wherein the first control signal is provided to a greater number of electrical components in each delay element than the second control signal.

15. The device of claim 12, wherein the one or more locations along the first delay line and the second delay line comprise one or more pairs of electrically parallel delay elements arranged at different locations along the first delay line and the second delay line.

16. The device of claim 10, wherein the pairs of delay elements are complementary pairs of delay elements.

17. The device of claim 10, wherein the pairs of delay elements each comprises two delay elements electrically coupled to one another.

18. The device of claim 10, wherein the signal crossover point is a first signal crossover point, and wherein the crossover control module is further configured to utilize a second signal crossover point for output signals received from a third delay element and a fourth delay element of the plurality of delay elements.

19. The device of claim 18, wherein the crossover control module is configured to generate excess current to vary a control-signal voltage while the first signal crossover point is different from the second signal crossover point and to provide a steady-state control-signal voltage when the first signal crossover point is substantially equal to the second signal crossover point.

20. A multi-phase clock generator, comprising:
electrically parallel first and second delay lines having a plurality of complementary delay elements;
an input buffer and crossover control module configured to receive a first source clock input signal and a second source clock input signal from a clock signal source, the second source clock input signal being complementary to the first source clock input signal, the input buffer and crossover control module further configured to receive feedback signals from the electrically parallel first and second delay lines, and to output to the electrically parallel first and second delay lines complementary clock input signals by determining crossover error in the first source clock input signal and the second source clock input signal based at least in part upon the feedback signals received from the electrically parallel first and second delay lines; and
a control circuit configured to control the electrically parallel first and second delay lines based at least in part upon rising and falling edges of one or more output clock signals output at one or more locations along the electrically parallel first and second delay lines.

* * * * *